US012790689B2

(12) United States Patent
Hashigami

(10) Patent No.: US 12,790,689 B2
(45) Date of Patent: Nov. 10, 2026

(54) METHOD FOR FORMING FILM, FILM-FORMING APPARATUS, SUSCEPTOR, AND α-GALLIUM OXIDE FILM

(71) Applicant: SHIN-ETSU CHEMICAL CO., LTD., Tokyo (JP)

(72) Inventor: Hiroshi Hashigami, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 19/102,895

(22) PCT Filed: Aug. 14, 2023

(86) PCT No.: PCT/JP2023/029452
§ 371 (c)(1),
(2) Date: Feb. 11, 2025

(87) PCT Pub. No.: WO2024/043134
PCT Pub. Date: Feb. 29, 2024

(65) Prior Publication Data

US 2026/0055504 A1 Feb. 26, 2026

(30) Foreign Application Priority Data

Aug. 26, 2022 (JP) ................................ 2022-135279

(51) Int. Cl.
*B32B 3/02* (2006.01)
*C23C 16/40* (2006.01)
(Continued)

(52) U.S. Cl.
CPC ........... *C23C 16/4486* (2013.01); *B32B 3/02* (2013.01); *C23C 16/40* (2013.01);
(Continued)

(58) Field of Classification Search
None
See application file for complete search history.

(56) References Cited

U.S. PATENT DOCUMENTS

2016/0222511 A1 8/2016 Sasaki et al.
2017/0274410 A1 9/2017 Shirahata et al.
(Continued)

FOREIGN PATENT DOCUMENTS

JP 2005-197275 * 7/2005
JP 2005-197275 A 7/2005
(Continued)

OTHER PUBLICATIONS

Oct. 24, 2023 International Search Report issued in International Patent Application No. PCT/JP2023/029452.
(Continued)

*Primary Examiner* — Elizabeth E Mulvaney
(74) *Attorney, Agent, or Firm* — Oliff PLC

(57) ABSTRACT

A method for forming a film, including: atomizing a raw material solution into a mist to form raw material mist; mixing raw material mist and a carrier gas to form gas mixture; placing a substrate on a placement section of susceptor; supplying gas mixture from an atomizer to the substrate to perform film formation by thermal reaction on substrate; and discharging gas mixture after the film formation through an exhaust unit, wherein in the step of supplying the gas mixture from atomizer to substrate to perform film formation by thermal reaction on the substrate, at least a part of gas mixture is supplied from a smooth section adjacent to placement section to a surface of substrate, the smooth section having a surface roughness of 200 μm or less. A method for forming a film capable of uniformly and stably producing a high-quality film on a surface of a large-diameter substrate.

17 Claims, 5 Drawing Sheets

(51) Int. Cl.

| | |
|---|---|
| ***C23C 16/448*** | (2006.01) |
| ***C23C 16/458*** | (2006.01) |
| ***C23C 16/46*** | (2006.01) |
| ***C30B 25/10*** | (2006.01) |
| ***C30B 25/12*** | (2006.01) |
| ***C30B 25/14*** | (2006.01) |
| ***C30B 29/16*** | (2006.01) |

(52) U.S. Cl.
CPC .......... *C23C 16/4583* (2013.01); *C23C 16/46* (2013.01); *C30B 25/10* (2013.01); *C30B 25/12* (2013.01); *C30B 25/14* (2013.01); *C30B 29/16* (2013.01)

(56) References Cited

U.S. PATENT DOCUMENTS

| | | | |
|---|---|---|---|
| 2018/0371613 | A1 | 12/2018 | Nagaoka |
| 2019/0153597 | A1 | 5/2019 | Satoh et al. |
| 2019/0214248 | A1 | 7/2019 | Nagaoka |
| 2020/0181795 | A1 | 6/2020 | Nagaoka et al. |
| 2020/0388491 | A1 | 12/2020 | Nagaoka et al. |
| 2021/0404089 | A1 | 12/2021 | Watanabe et al. |
| 2022/0411926 | A1 | 12/2022 | Hashigami et al. |
| 2024/0102159 | A1 | 3/2024 | Hashigami |

FOREIGN PATENT DOCUMENTS

| | | | | |
|---|---|---|---|---|
| JP | 2006-070342 | A | | 3/2006 |
| JP | 2013-028480 | A | | 2/2013 |
| JP | 2016-027636 | | * | 2/2016 |
| JP | 2016-027636 | A | | 2/2016 |
| JP | 2016-146442 | A | | 8/2016 |
| JP | 2019119925 | A | | 7/2019 |
| JP | 2020-113570 | A | | 7/2020 |
| JP | 2020198410 | A | | 12/2020 |
| JP | 2021031358 | A | | 3/2021 |
| JP | 2021066633 | A | | 4/2021 |
| JP | 2022-093208 | A | | 6/2022 |
| KR | 2020-0079084 | | * | 7/2020 |
| WO | 2016/051559 | A1 | | 4/2016 |
| WO | 2020/194802 | A1 | | 10/2020 |
| WO | 2021172152 | A | | 9/2021 |
| WO | 2022/215621 | A1 | | 10/2022 |

OTHER PUBLICATIONS

Mar. 1, 2025 International Preliminary Report on Patentability issued in International Patent Application No. PCT/JP2023/029452.

Kim, Kyoung-Ho et al. "Growth of 2-Inch α-Ga2O3 Epilayers via Rear-Flow-Controlled Mist Chemical Vapor Deposition." ECS Journal of Solid State Science and Technology. vol. 8, No. 7, pp. Q3165-Q3170, 2019.

Oct. 7, 2025 Notification of Reasons for Refusal issued in Japanese Patent Application No. 2024-542763.

Mar. 3, 2026 Office Action issued in Japanese Patent Application No. 2024-542763.

Hoki S. et al. "Influence of Post-Annealing on Properties of a Ga2O3 Epilayer Grown by Halide Vapor Phase Epitaxy". ECS Journal of Solid State Science and Technology, pp. 3023-3027, 2019.

Jul. 2, 2026 Office Action issued in Indian Patent Application No. 202547013782.

Jul. 22, 2026 Search Report issued in European Patent Application No. 23857247.3.

* cited by examiner

[FIG. 1]
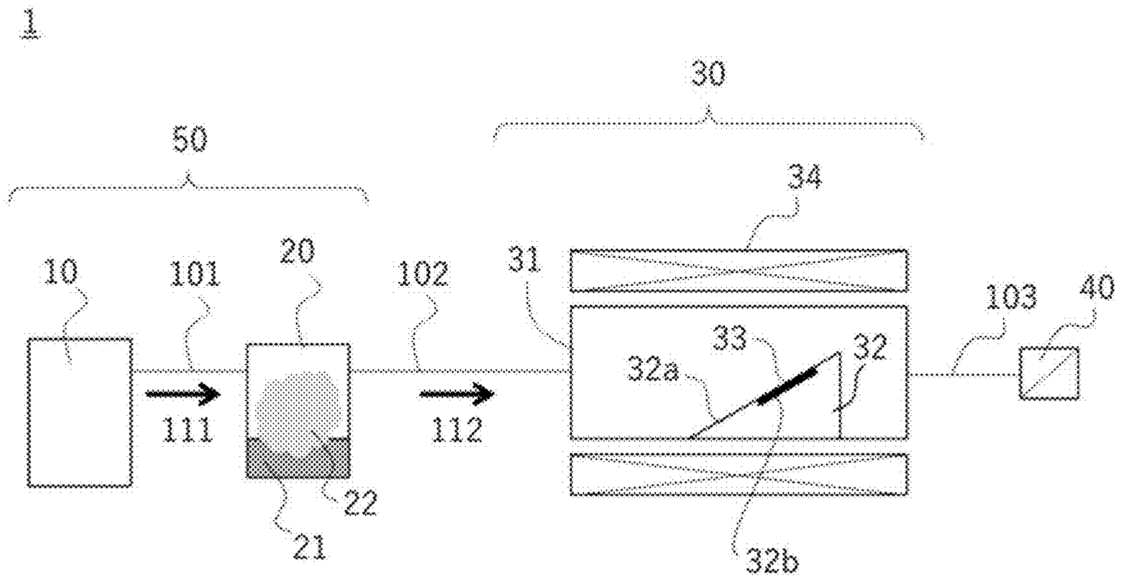
[FIG. 2]
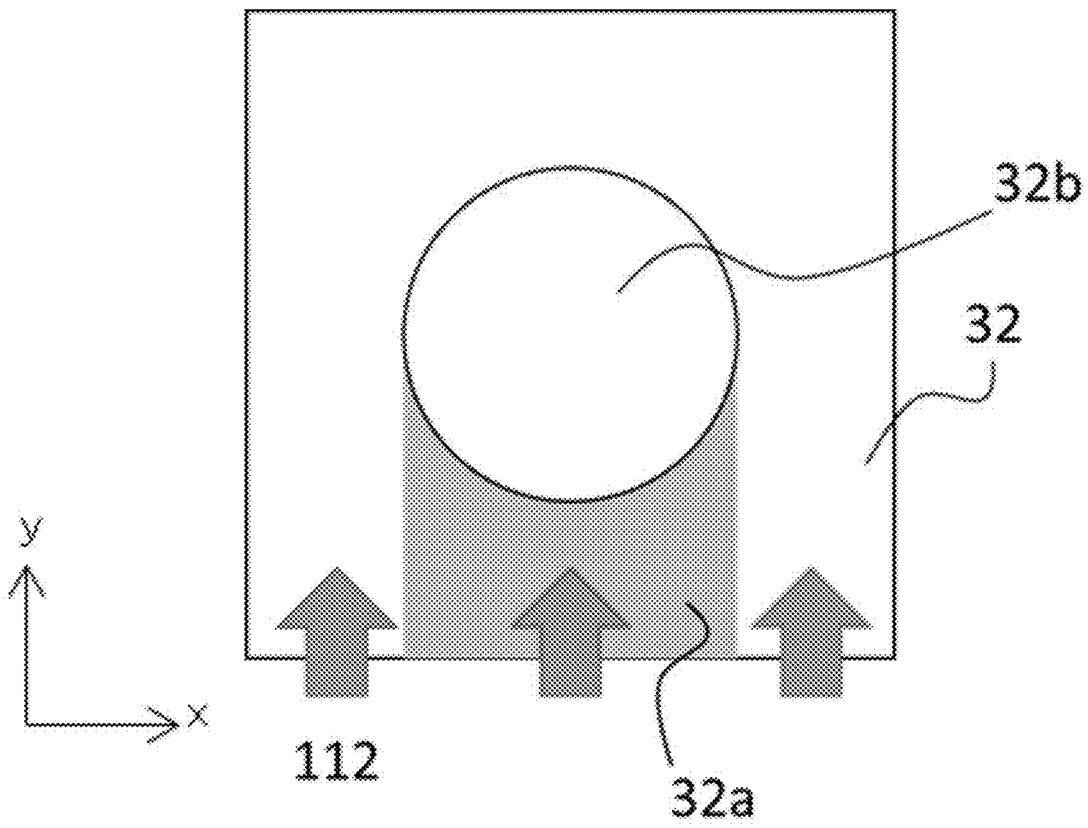

[FIG. 3a]
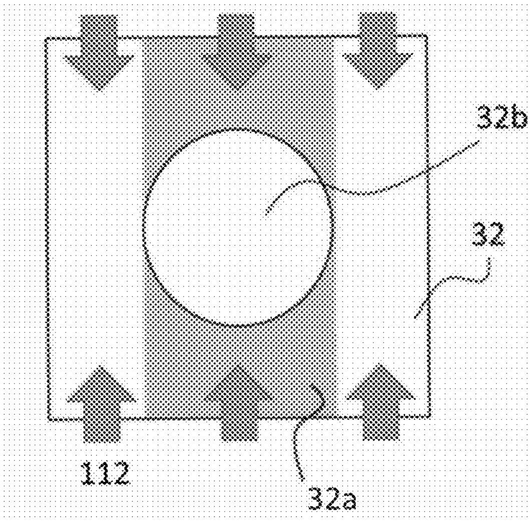
[FIG. 3b]
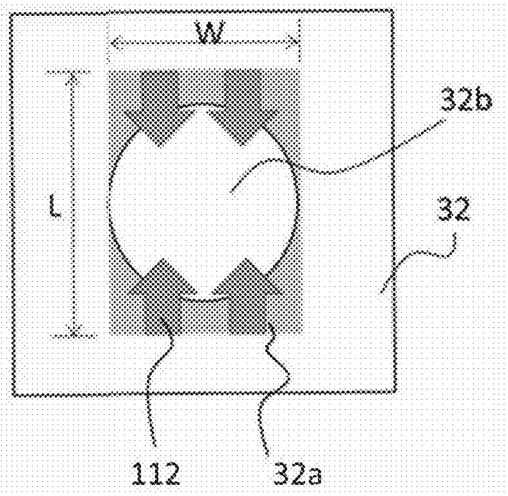
[FIG. 4]
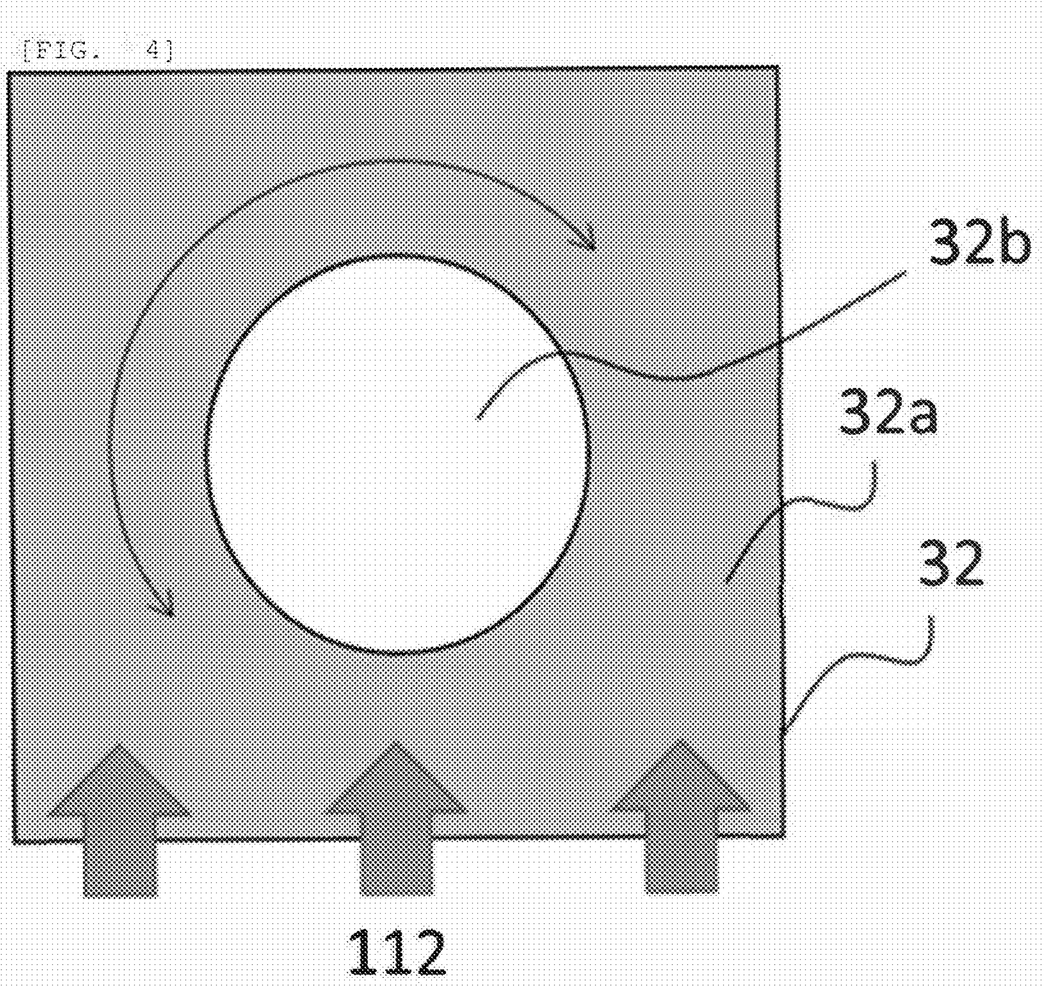

[FIG. 5]
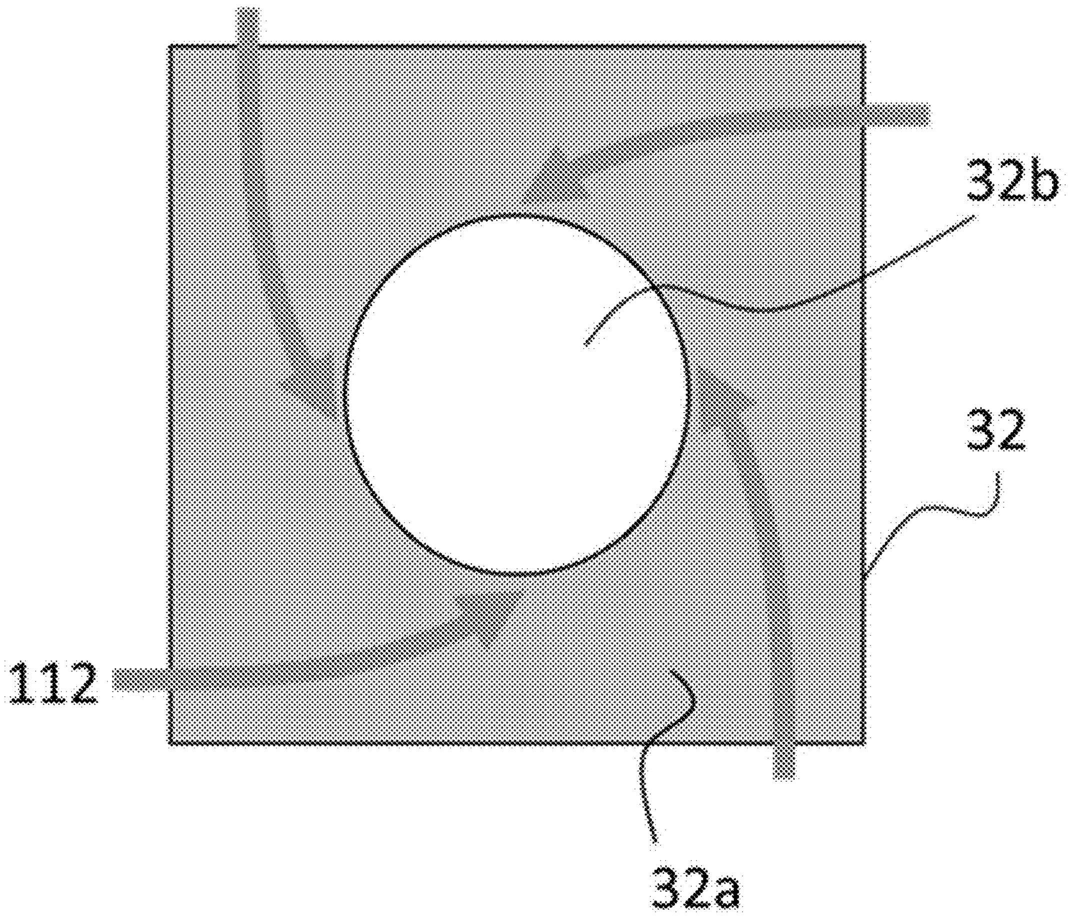
[FIG. 6]
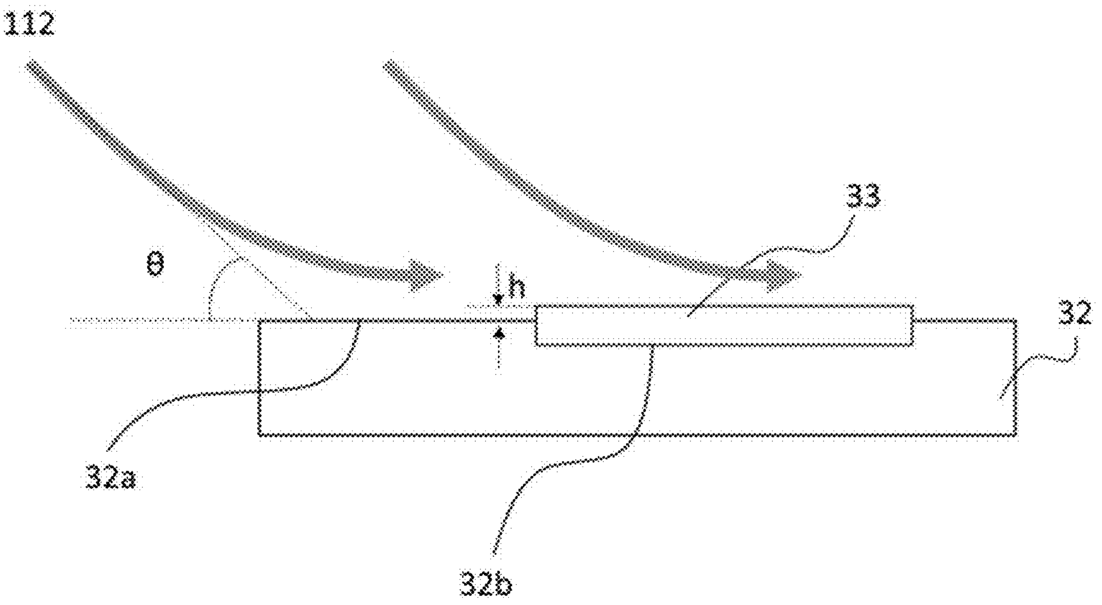

[FIG. 7]
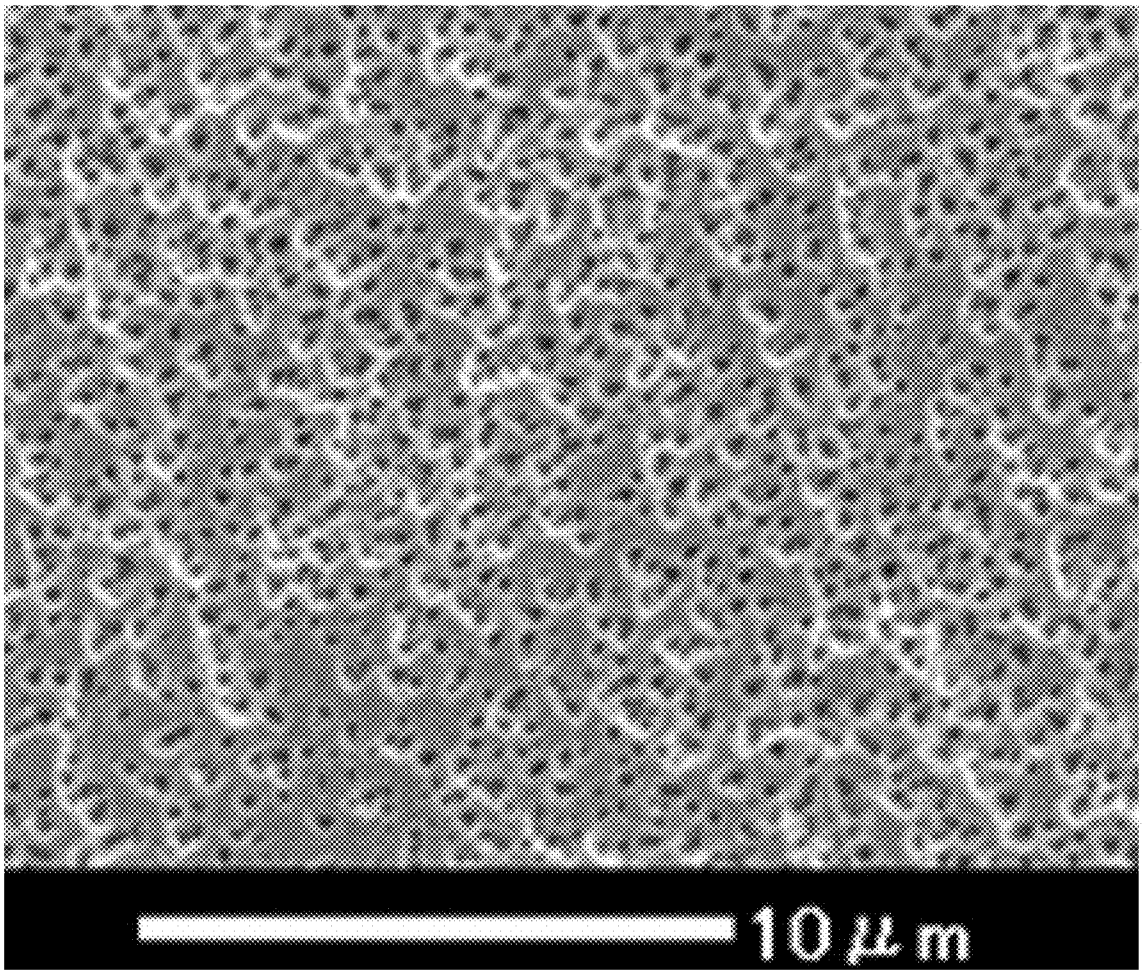

[FIG. 8]
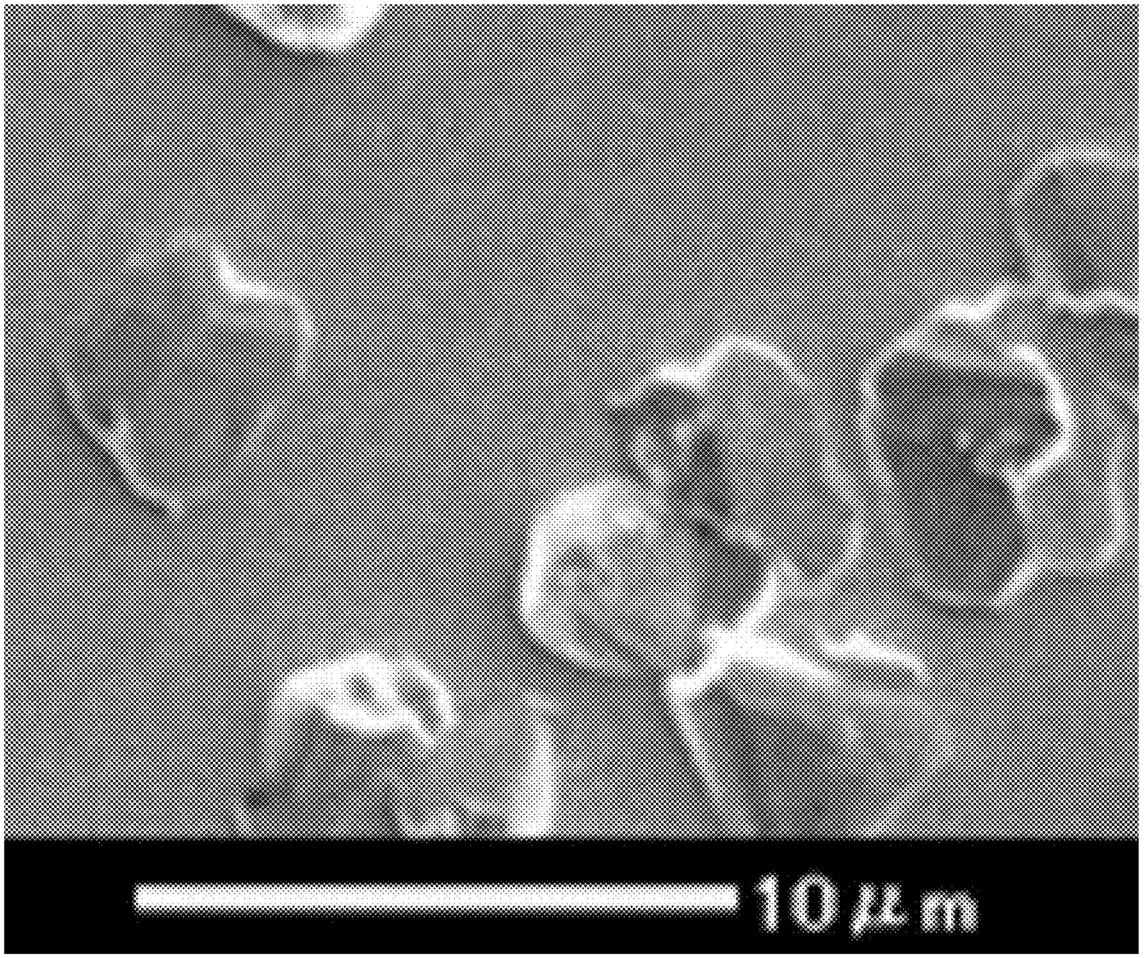

METHOD FOR FORMING FILM, FILM-FORMING APPARATUS, SUSCEPTOR, AND α-GALLIUM OXIDE FILM

TECHNICAL FIELD

The present invention relates to a method for forming a film, a film-forming apparatus, a susceptor, and an α-gallium oxide film.

BACKGROUND ART

As a method capable of forming an epitaxial film etc. at a low temperature under an atmospheric pressure, deposition methods using water particles, such as a mist CVD method, have been known.

Patent Document 1 discloses an apparatus that forms a film by placing a substrate at an angle in a horizontal furnace, the substrate being mounted on an approximately semicircular susceptor.

Patent Document 2 discloses a film-forming apparatus that forms a film by securing a substrate to a flat flow channel called a fine channel and supplying a raw material mist horizontally to the substrate.

Patent Document 3 discloses a film-forming apparatus that forms a film while moving a film-forming nozzle including a raw material solution ejection part and an exhaust part parallel to a substrate, the film-forming nozzle being opposite a film formation surface of the substrate.

Furthermore, Patent Document 4 discloses a method for forming a film, in which a raw material mist is conveyed into a reaction vessel by a carrier gas, and further a rotational flow is generated to react the mist with a substrate.

CITATION LIST

Patent Literature

Patent Document 1: JP 2016-27636 A
Patent Document 2: JP 2013-28480 A
Patent Document 3: WO 2016/051559 A1
Patent Document 4: JP 2016-146442 A

SUMMARY OF INVENTION

Technical Problem

However, these conventional film-forming apparatuses have problems of significant generation and adhesion of powder, resulting in a large number of defects introduced into a film or cloudiness caused by abnormal growth of a film.

The present invention has been made to solve the above problems, and aims to provide a method for forming a film, a film-forming apparatus, and a susceptor, that enable to uniformly and stably produce a high-quality film on a surface of a large-diameter substrate.

Additionally, the present invention aims to provide an α-gallium oxide film with higher quality than conventional ones.

Solution to Problem

To achieve the above objects, the present invention provides a method for forming a film, including the steps of: atomizing a raw material solution into a mist to form a raw material mist; mixing the raw material mist and a carrier gas to form a gas mixture; placing a substrate on a placement section of a susceptor; supplying the gas mixture from an atomizer to the substrate to perform film formation by thermal reaction on the substrate; and discharging the gas mixture after the film formation through an exhaust unit, wherein in the step of supplying the gas mixture from the atomizer to the substrate to perform film formation by thermal reaction on the substrate, at least a part of the gas mixture is supplied from a smooth section adjacent to the placement section to a surface of the substrate, the smooth section having a surface roughness of 200 μm or less.

According to such method for forming a film, it is possible to uniformly and stably produce a high-quality film on a surface of a large-diameter substrate. Specifically, such method for forming a film is capable of stably producing a high-quality film on a surface of a large-diameter substrate since it can maintain the gas mixture containing the raw material mist as a laminar flow while supplying the same to the substrate, thereby reducing generation of powder and abnormal growth.

In this case, the surface roughness can be 150 μm or less.

This enables to more uniformly and stably produce a film with higher quality.

In this case, difference in height between a surface of the smooth section and the surface of the substrate placed on the placement section can be −1 mm or more and +1 mm or less.

This enables to more stably maintain the gas mixture as a laminar flow, thereby producing a high-quality film stably and uniformly.

In this case, an angle between a surface of the smooth section and a flowing direction of the gas mixture into the smooth section can be 0° or more and 60° or less.

This enables to effectively prevent generation of powder, thereby more stably producing a film with even higher quality.

To achieve the above objects, the present invention provides a film-forming apparatus, including: a carrier gas supplier configured to supply a carrier gas; an atomizer configured to atomize a raw material solution into a mist to generate a raw material mist; a film-forming unit configured to supply a gas mixture of the raw material mist and the carrier gas to a substrate to perform film formation; and a heater capable of heating the substrate, wherein the film-forming unit has a susceptor including a placement section on which the substrate is placed, the susceptor includes a smooth section adjacent to the placement section, on which at least a part of the gas mixture flows, and the smooth section has a surface roughness of 200 μm or less.

According to such film-forming apparatus, it is possible to uniformly and stably produce a high-quality film on a surface of a large-diameter substrate. Specifically, such film-forming apparatus is capable of stably producing a high-quality film on a surface of a large-diameter substrate since it can maintain the gas mixture containing the raw material mist as a laminar flow while supplying the same to the substrate, thereby reducing generation of powder and abnormal growth.

In this case, the surface roughness can be 150 μm or less.

This enables to more uniformly and stably produce a film with higher quality.

In this case, difference in height between a surface of the smooth section and a surface of the substrate placed on the placement section can be −1 mm or more and +1 mm or less.

This makes it possible to more stably maintain the gas mixture as a laminar flow, thereby enabling stable and uniform production of a high-quality film.

In this case, an angle between a surface of the smooth section and a flowing direction of the gas mixture into the smooth section can be 0° or more and 60° or less.

This makes it possible to effectively prevent generation of powder, thereby enabling more stable production of a film with even higher quality.

To achieve the above objects, the present invention provides a susceptor including a placement section on which a substrate is placed in a film-forming apparatus, the film-forming apparatus including: a carrier gas supplier configured to supply a carrier gas; an atomizer configured to atomize a raw material solution into a mist to generate a raw material mist; a film-forming unit configured to supply a gas mixture of the raw material mist and the carrier gas to the substrate to perform film formation; and a heater capable of heating the substrate, wherein a smooth section on which at least a part of the gas mixture flows is disposed adjacent to the placement section, and the smooth section has a surface roughness of 200 μm or less.

According to such susceptor, it is possible to uniformly and stably produce a high-quality film on a surface of a large-diameter substrate. Specifically, since such susceptor enables the gas mixture containing the raw material mist to be maintained as a laminar flow while being supplied to the substrate, generation of powder and abnormal growth can be reduced, thereby enabling stable production of a high-quality film on a surface of a large-diameter substrate.

In this case, the surface roughness can be 150 μm or less.

This enables to more uniformly and stably produce a film with higher quality.

In this case, the smooth section can have the surface roughness of 200 μm or less, and difference in height between a surface of the smooth section and a surface of the substrate placed on the placement section can be −1 mm or more and +1 mm or less.

This enables to more uniformly and stably produce a film with higher quality.

To achieve the above objects, the present invention provides an α-gallium oxide film to be formed on approximately an entire surface of a c-plane sapphire substrate having a diameter of 4 inches or more, wherein the α-gallium oxide film has a half width of an x-ray diffraction rocking curve peak of a (0006) plane of 9.5 seconds or less, and a film thickness distribution of ±9% or less.

This enables the α-gallium oxide film to have a good crystal orientation, a favorable film thickness distribution, and high quality.

To achieve the above objects, the present invention provides an α-gallium oxide film to be formed on approximately an entire surface of a c-plane sapphire substrate having a diameter of 4 inches or more, wherein a foreign substance density in the α-gallium oxide film is 1.1 $cm^{-2}$ or less, and a film thickness distribution of the α-gallium oxide film is +9% or less.

This enables the α-gallium oxide film to have a low foreign substance density, a favorable film thickness distribution, and high quality.

Advantageous Effects of Invention

As described above, the method for forming a film of the present invention makes it possible to stably produce a high-quality film, thereby enabling highly productive film formation.

The film-forming apparatus and the susceptor of the present invention make it possible to stably produce a high-quality film, thereby enabling highly productive film formation.

As described above, the α-gallium oxide film of the present invention can be of higher quality than conventional ones.

BRIEF DESCRIPTION OF DRAWINGS

FIG. 1 is a diagram illustrating one configuration of a film-forming apparatus according to the present invention;

FIG. 2 is a diagram illustrating one configuration of a susceptor of a film-forming apparatus according to the present invention;

FIG. 3(*a*) is a diagram illustrating another configuration of a susceptor of a film-forming apparatus according to the present invention, and FIG. 3(*b*) is a diagram illustrating yet another configuration of a susceptor of a film-forming apparatus according to the present invention;

FIG. 4 is a diagram illustrating yet another configuration of a susceptor of a film-forming apparatus according to the present invention;

FIG. 5 is a diagram illustrating yet another configuration of a susceptor of a film-forming apparatus according to the present invention;

FIG. 6 is a diagram illustrating one form of a flow of a gas mixture toward a substrate placed on a susceptor of a film-forming apparatus according to the present invention;

FIG. 7 shows examples of various recesses and protrusions with abnormal growth of a film surface as can been seen by microscopic observation on cloudiness; and FIG. 8 shows other examples of various recesses and protrusions with abnormal growth of a film surface as can been seen by microscopic observation on cloudiness.

DESCRIPTION OF EMBODIMENTS

Hereinafter, the present invention will be described in detail. However, the present invention is not limited thereto.

As described above, there have been demands for a method for forming a film, a film-forming apparatus, and a susceptor, that enable to uniformly and stably produce a high-quality film on a surface of a large-diameter substrate.

The present inventor has made an intensive investigation on the above problem, and consequently found that:

- stable production of a high-quality film and thus highly productive film formation are made possible by a method for forming a film, including the steps of: atomizing a raw material solution into a mist to form a raw material mist; mixing the raw material mist and a carrier gas to form a gas mixture; placing a substrate on a placement section of a susceptor; supplying the gas mixture from an atomizer to the substrate to perform film formation by thermal reaction on the substrate; and discharging the gas mixture after the film formation through an exhaust unit, wherein in the step of supplying the gas mixture from the atomizer to the substrate to perform film formation by thermal reaction on the substrate, at least a part of the gas mixture is supplied from a smooth section adjacent to the placement section to a surface of the substrate, the smooth section having a surface roughness of 200 μm or less; and
- stable production of a high-quality film and thus highly productive film formation are made possible by a film-forming apparatus, including: a carrier gas supplier configured to supply a carrier gas; an atomizer configured to atomize a raw material solution into a mist to generate a raw material mist; a film-forming unit configured to supply a gas mixture of the raw material mist and the carrier gas to a substrate to perform film formation; and a heater capable of heating the substrate, wherein the film-forming unit has a susceptor including a placement section on which the substrate is placed, the susceptor includes a smooth section adjacent to the placement section, on which at least a part of the gas mixture flows, and the smooth section has a surface roughness of 200 μm or less; and stable production of a high-quality film and thus highly productive film formation are made possible by a susceptor including a placement section on which a substrate is placed in a film-forming apparatus, the film-forming apparatus including: a carrier gas supplier configured to supply a carrier gas; an atomizer configured to atomize a raw material solution into a mist to generate a raw material mist; a film-forming unit configured to supply a gas mixture of the raw material mist and the carrier gas to the substrate to perform film formation; and a heater capable of heating the substrate, wherein a smooth section on which at least a part of the gas mixture flows is disposed adjacent to the placement section, and the smooth section has a surface roughness of 200 μm or less, and completed the present invention.

Furthermore, as described above, there has been a demand for an α-gallium oxide film with higher quality than conventional ones.

The present inventor has made an intensive investigation on the above problem, and consequently found that α-gallium oxide film with higher quality than conventional ones can be realized as: an α-gallium oxide film to be formed on approximately an entire surface of a c-plane sapphire substrate having a diameter of 4 inches or more, wherein the α-gallium oxide film has a half width of an x-ray diffraction rocking curve peak of a (0006) plane of 9.5 seconds or less, and a film thickness distribution of +9% or less; and an α-gallium oxide film to be formed on approximately an entire surface of a c-plane sapphire substrate having a diameter of 4 inches or more, wherein a foreign substance density in the α-gallium oxide film is 1.1 $cm^{-2}$ or less, and a film thickness distribution of the α-gallium oxide film is +9% or less, and completed the present invention.

Hereinafter, the present invention will be described in detail with reference to the drawings. However, the present invention is not limited thereto.

First Embodiment

Film-Forming Apparatus

Firstly, one configuration of a film-forming apparatus according to the present invention will be described.

FIG. 1 illustrates one configuration of a film-forming apparatus according to the present invention. However, the film-forming apparatus according to the present invention is not limited to the film-forming apparatus illustrated in FIG. 1.

As illustrated in FIG. 1, a film-forming apparatus 1 according to the present invention includes a mechanism 50 for forming a gas mixture, a film-forming unit 30, and an exhaust unit 40. The mechanism 50 for forming a gas mixture has a carrier gas supplier 10 and an atomizer 20.

The carrier gas supplier 10 and the atomizer 20 are coupled to each other by a pipe 101. A carrier gas 111 is supplied from the carrier gas supplier 10 to the atomizer 20, in which a gas mixture is formed.

The atomizer 20 and a deposition chamber 31 of the film-forming unit 30 are coupled to each other by a pipe 102, and a gas mixture 112 is supplied from the atomizer 20 to the deposition chamber 31 of the film-forming unit 30.

The deposition chamber 31 of the film-forming unit 30 and the exhaust unit 40 are coupled to each other by a pipe 103, and the gas is discharged from the deposition chamber 31 of the film-forming unit 30 to the exhaust unit 40.

Note that the pipe 102 is not particularly limited as long as it has sufficient stability against a raw material solution 21 to be used, a temperature at an interface between the film-forming unit 30 and the pipe 102, etc., and can be made of resin, metal, glass, ceramic, or a combination of these materials according to its purpose.

The pipe 101 and the pipe 103 are also not particularly limited as long as they have sufficient stability.

(Carrier Gas Supplier 10)

The carrier gas supplier 10 supplies the carrier gas 111 toward the atomizer 20.

The carrier gas 111 is not particularly limited, and for example, air, oxygen, ozone, an inert gas such as nitrogen and argon, or a reducing gas such as hydrogen gas and forming gas is suitably used. The carrier gas 111 may include one kind or two or more kinds of carrier gasses. A flow rate of the carrier gas 111 may be set as appropriate depending on a size of a substrate 33 and a size of the film-forming unit 30, and can be set to about 0.01 to 100 L/min, for example.

Although not illustrated, it is also possible to further add a dilution gas to adjust proportions of a raw material mist 22 and the carrier gas 111. A flow rate of the dilution gas may be set as appropriate, and can be set to 0.1 to 10 times of the flow rate of the carrier gas, for example. The dilution gas is preferably supplied to a downstream side of the atomizer 20, for example. The dilution gas to be used may be the same as or different from the carrier gas 111.

(Atomizer 20)

Inside the atomizer 20, the raw material solution 21 is housed as a raw material. The raw material solution 21 is not particularly limited as long as the solution can be atomized (also referred to as "atomized into a mist"), and an aqueous solution containing a raw material according to its purpose, or an organic solvent solution such as alcohols, ketones, esters, ethers, amides, halogenated solvents, and aromatic compounds can be applied.

The raw material solution 21 is atomized by using a known technique to form the raw material mist 22.

The carrier gas 111 is supplied to the atomizer 20 and mixed with the raw material mist 22 to form the gas mixture 112.

The atomization of the raw material solution 21 is not particularly limited as long as the raw material solution 21 can be atomized into a mist or formed into droplets, and may be performed in a known manner. In the present invention, ultrasonic waves are preferably used. The mist or droplet obtained using ultrasonic waves is preferable because they have zero initial velocity and float in the air. For example, the mist can be conveyed as a gas floating in a space, rather than sprayed, without damage due to collision energy, and thus very suitable. A size of the droplet is not particularly limited, and may be a few millimeters. The size is preferably 50 μm or less, and more preferably 0.1 to 10 μm.

The atomizer 20 can include a temperature control unit (not shown). The temperature control unit may directly or indirectly control a temperature of the raw material solution 21, or may perform heat exchange using a liquid or gas heating medium, or may apply Peltier effect.

Known heating mediums can widely be used as the heating medium. For example, a liquid heating medium such as water, glycols, alcohols, and silicon oils, or a gas heating medium such as air, helium, and fluorocarbons is suitably used.

(Film-Forming Unit 30)

As illustrated in FIG. 1, the film-forming unit 30 includes the deposition chamber 31 and a heater 34.

Inside the deposition chamber 31, a susceptor 32 having a triangular shape in side view is disposed.

On an inclined surface of the susceptor 32, the substrate 33 is placed.

The pipe 102 is coupled to one wall of the deposition chamber 31 while the pipe 103 is coupled to the other wall of the deposition chamber 31. The gas mixture 112 is conveyed through the pipe 102 and supplied to the deposition chamber 31.

The deposition chamber 31 is not particularly limited as long as it has sufficient stability against the raw material solution 21 to be used and a use temperature, and may be made of resin, metal, glass, ceramic, or a combination of these materials according to its purpose.

The film formation may be performed under any condition of an atmospheric pressure, an increased pressure, and a reduced pressure, but preferably performed under an atmospheric pressure in view of an apparatus cost and productivity.

FIG. 2 illustrates one configuration of the susceptor of the film-forming apparatus according to the present invention. FIG. 2 illustrates one configuration of the susceptor, where the gas mixture 112 always flows in one direction (y direction) on the susceptor 32.

As illustrated in FIG. 2, the susceptor 32 includes a circular placement section **32*b* at the center of the plane. The placement section 32*b* allows the substrate 33** to be placed thereon.

(Susceptor Structure and Material)

A structure, a material, etc. of the susceptor 32 are not particularly limited, and may has sufficient stability according to a property of the raw material solution 21 to be used and temperature conditions.

The structure of the susceptor 32 may include a mechanism (not shown) for holding the substrate 33. In this case, a known method for holding a substrate, such as a vacuum chuck, a mechanical clamp, or an electrostatic chuck, is applicable.

As the material for the susceptor 32, metals such as aluminum and stainless steel may be used. In a case of forming a film at a higher temperature exceeding heat resistance temperature of these metals, or in a case of using an acidic or alkaline raw material, alloys such as Hastelloy (registered trademark), or ceramics such as soda-lime glass, borosilicate glass, quarts, silicon carbide, silicon nitride, and aluminum nitride may be used.

In a lower portion of the susceptor 32 adjacent to the placement section **32*b*, a smooth section 32*a* is disposed. The smooth section 32*a* is installed upstream of the placement section 32*b*, that is, on the side where the gas mixture 112 flows into the susceptor 32, and is adjacent to the placement section 32*b*. The smooth section 32*a*** has a smooth surface.

Through the smooth section **32*a*, at least a part of the gas mixture 112 flows. In other words, a part of the gas mixture 112 supplied to the deposition chamber 31 directly flows in a straight line to a surface of the substrate 33, and the other is supplied to the surface of the substrate 33 along the smooth section 32*a*. In the course of this process, the gas mixture 112 reacts on the substrate 33 and a film is formed on the substrate 33**.

The smooth section **32*a* is preferably disposed so as to include at least an area in contact with both ends of the placement section 32*b* (or alternatively, the substrate (not shown)) in x direction. This makes it possible to supply the gas mixture 112 to the substrate surface while constantly keeping the gas mixture 112** as a laminar flow, thereby enabling stable and favorable crystal growth on the substrate surface.

A surface roughness (arithmetic mean roughness) Ra_cor of the smooth section **32*a* is defined as 200 μm or less. This can make the gas mixture 112, that is supplied to the surface of the substrate 33 along the smooth section 32*a***, a flow with less turbulence, thereby allowing stable formation of a uniform film with high quality.

When the surface roughness (arithmetic mean roughness) Ra_cor of the smooth section **32*a* exceeds 200 μm, the gas mixture becomes turbulence, causing significant adhesion of particles or cloudy appearance due to abnormal growth. Cloudiness is microscopically observed as various recesses and protrusions with abnormal growth of the film surface, as shown in FIGS. 7 and 8**, for example. Such abnormal growth is often caused by abnormal nucleation due to adhesion of a foreign substance or uneven composition of a film. Macroscopically, the degree thereof can be visually determined in most cases, or can be quantified by measuring reflectance or transmittance of visible ray or measuring recesses and protrusions on the surface, for example. Known methods can widely be applied to such measurement, and a common spectrophotometer, stylus surface shape measurement system, or atomic force microscope is suitably used. Particularly, when the thin film is transparent in the visible light range, it can be determined based on regular reflectance of visible light incident on the film surface at a certain angle. Specifically, in a case of gallium oxide, for example, the regular reflectance can be 15% or less under conditions of an incident light wavelength of 633 nm and an incident angle of 45°, for example. Note that the regular reflectance refers to a ratio of energy of incident light to reflected light when light incident on a sample (film) surface from a light source is reflected and received by a light-receiving probe at a reflection angle equal to an incident angle.

Note that "particle" in the present invention includes the one incorporated into a film and integrated with the film and the one attached to a film surface as a foreign substance. The "particle" refers to the one determined as a particle when observed on a film surface, and can be measured using light scattering, for example. The surface roughness (arithmetic mean roughness) Ra_cor of the smooth section **32*a*** is preferably 150 μm or less. A lower limit thereof is not particularly limited, and can be 0.1 nm, for example.

The surface roughness (arithmetic mean roughness) Ra refers to a value calculated based on JIS B 0601 using measurement results of surface profile by a stylus method, an atomic force microscope (AFM) method, or a non-contact measurement method using a laser microscope or confocal microscope, such as optical interferometry, confocal microscopy, and an image synthesis method with focus movement.

A material used for the smooth section **32*a*** may be the same as or different from the material for the susceptor. Specifically, aluminum, stainless steel, alloys such as Hastelloy (registered trademark), or ceramics such as soda-lime glass, borosilicate glass, quarts, silicon carbide, silicon nitride, and aluminum nitride may be used.

Smoothness of such smooth section 32*a* is easily obtained, for example, in a case of borosilicate glass, by lapping the surface with diamond abrasive grain, and thereafter further giving a mirror finish by chemical mechanical polishing (CMP) using colloidal silica.

Furthermore, the smooth section 32*a* may be maintained at a lower temperature than that of the substrate placement section 32*b*. This can prevent the raw material mist from evaporating on the surface of the smooth section 32*a*, thereby reducing particle generation due to the evaporated mist and further maintaining smoothness of the smooth section 32*a* for a longer period of time. In this case, the temperature of the smooth section 32*a* may be optimized as appropriate depending on the kind of the raw material mist and various conditions thereof for film formation. In a case of using water as a solvent for the raw material mist, in general, the temperature is preferably set to about 30° C. to 100° C. A method for cooling the smooth section 32*a* is not particularly limited and a known temperature control technique can be applied. For example, a coolant (not shown) may be brought into contact with the inside or back face of the smooth section 32*a* to perform heat exchange, or a Peltier element may be used for cooling.

(Substrate)

The substrate 33 is capable of supporting a film to be formed.

A material for the substrate 33 is not particularly limited, and may be a known material, or may be an organic compound, an inorganic simple substance, or an inorganic compound. Examples thereof include, but are not limited to, polysulfone, polyethersulfone, polyphenylene sulfide, polyetheretherketone, polyimide, polyetherimide, fluororesin, metals such as iron, aluminum, stainless steel, and gold, silicon, sapphire, quarts, glass, calcium carbonate, lithium tantalate, lithium niobate, gallium oxide, SiC, ZnO, GaN, and the like.

Regarding a size of the substrate 33, an area thereof is preferably 5 $cm^2$ or more, more preferably 10 $cm^2$ or more, and a thickness thereof is preferably 50 to 2000 μm, more preferably 100 to 800 μm.

The substrate 33 has a circular shape in plan view, as can be inferred from the shape of the placement section illustrated in FIG. 2. However, the shape is not limited thereto, and may be a rectangular or polygonal shape in plan view.

Note that when the shape or size of the substrate 33 is changed, the shape or size of the placement section 32*b* will be changed according to the shape or size of the substrate 33.

(Smoothness of Substrate)

A surface roughness (arithmetic mean roughness) Ra_sub of the surface of the substrate 33 is preferably equal to or less than the surface roughness (arithmetic mean roughness) Ra_cor of the surface of the smooth section 32*a*. This makes it possible to maintain the gas mixture as a laminar flow even on the substrate surface. When the surface roughness (arithmetic mean roughness) Ra_sub of the surface of the substrate 33 is greater than the surface roughness (arithmetic mean roughness) Ra_cor of the surface of the smooth section 32*a*, abnormal growth is more likely to occur on the substrate 33.

The surface roughness (arithmetic mean roughness) Ra_sub of the surface of the substrate 33 is preferably a value of 0.05 nm or more and 1 μm or less, for example.

Such smoothness of the surface of the substrate 33 can easily be obtained, for example, in a case of sapphire, by lapping, with diamond abrasive grain, the surface of the substrate 33 obtained by processing crystal, and thereafter further giving a mirror finish by chemical mechanical polishing (CMP) using colloidal silica.

Next, one form of a flow of the gas mixture toward the substrate placed on the susceptor of the film-forming apparatus according to the present invention will be described with reference to FIG. 6, from the viewpoints of an inflow direction of the gas mixture and difference in height between the substrate and the susceptor.

(Inflow Direction of Gas Mixture)

In the film-forming apparatus according to the present invention, the substrate 33 is placed on the substrate placement section 32*b* disposed in the susceptor 32, and a part of the gas mixture 112 flows along the smooth section 32*a* toward the substrate 33.

On this occasion, an angle θ between the inflow direction of the gas mixture 112 and the smooth section 32*a* is not particularly limited.

However, the angle θ is preferably 0° or more and 60° or less. When the angle θ exceeds 60°, the gas mixture 112 collides with the susceptor 32 or the upper surface of the substrate 33 to cause turbulence, which may partially cause generation of powder and adhesion thereof to the film surface. When the angle θ is 0° or more and 60° or less, such generation can be reduced. The angle θ is more preferably 0° or more and 45° or less.

Note that the angle θ in the configuration of FIG. 1 can also be regarded as an inclination angle of the smooth section 32*a* with respect to the horizontal plane.

(Difference in Height)

Difference in height h between the surface of the substrate 33 and the surface of the smooth section 32*a* is not particularly limited, but preferably-1 mm or more and 1 mm or less. The difference in height h within such range leads to improved thickness uniformity at the edge of the substrate and no generation of turbulence at the edge. If there is a step of 1 mm or more, a film thickness distribution may occur, particularly near the edge of the substrate adjacent to the smooth section 32*a*.

The positive or negative numerical value as described herein indicates the relative position of the substrate surface with respect to the surface of the smooth section. The negative value indicates that the substrate surface is recessed with respect to the surface of the smooth section, while the positive value indicates that the substrate surface is protruding with respect to the surface of the smooth section.

When the substrate surface is at a higher level than the surface of the smooth section, the gas mixture concentrates at the edge of the substrate, resulting in a thicker film thickness. Conversely, when the substrate surface is at a lower level than the surface of the smooth section, the step causes the flow of the gas mixture to pass over the edge of the substrate, resulting in a thinner film thickness. Additionally, such structure may cause turbulence in the flow of the gas mixture.

The thickness of the film formed on the substrate can be measured by every known method. For example, ellipsometry, optical interference spectroscopy, a stylus method, a laser displacement method, or the like is suitably used.

(Exhaust Unit 40)

The surplus gas mixture 112 not contributing to the film formation and byproducts generated during the reaction of the gas mixture 112 on the substrate 33 are sucked by the exhaust unit 40 as the gas mixture after the film formation and discharged outside the system.

The exhaust air from the exhaust unit 40 may be treated as necessary using an abatement device such as a particle collector, a combustion device, and a scrubber (not shown), or may be treated with a filter for recovering the raw material, or may be treated with a combination thereof.

Although FIG. 1 illustrates the configuration in which one atomizer 20 is used, the film-forming apparatus according to the present invention is not limited thereto and a plurality of atomizers 20 connected in series or parallel can also be used. In this case, each atomizer 20 for use may contain a different raw material solution from each other or contain the same raw material solution. Additionally, each raw material solution may be individually atomized and independently supplied to the film-forming unit 30, or a plurality of kinds of raw material mists may be premixed and then supplied to the film-forming unit 30.

Although FIGS. 1 and 2 each illustrates the configuration in which the gas mixture 112 flows in one direction from the supply side to the exhaust side of the deposition chamber 31 relative to the substrate 33, the present invention is not limited thereto and can be configured according to the supply method of the gas mixture 112 to the substrate.

Method for Forming Film

Next, the method for forming a film according to the present invention will be described with reference to FIGS. 1 and 2.

The method for forming a film according to the present invention includes a raw material mist forming step, a gas mixture forming step, a substrate placing step, a film forming step, and a discharge step.

(Raw Material Mist Forming Step)

The raw material mist forming step is a step of atomizing the raw material solution 21 into a mist to form the raw material mist 22.

(Gas Mixture Forming Step)

The gas mixture forming step is a step of mixing the raw material mist 22 and the carrier gas 111 to form the gas mixture 112.

(Substrate Placing Step)

The substrate placing step is a step of placing the substrate 33 on the placement section 32*b* of the susceptor 32.

(Film Forming Step)

The film forming step is a step of supplying the gas mixture 112 from the atomizer 20 to the substrate 33 and forming a film by thermal reaction on the substrate 33.

In this step, at least a part of the gas mixture 112 is supplied from the smooth section 32*a* adjacent to the placement section 32*b* to the surface of the substrate 33, the smooth section 32*a* having the surface roughness (arithmetic mean roughness) Ra_cor of 200 μm or less.

(Discharge Step)

The discharge step is a step of discharging the gas mixture 112 after the film formation through the exhaust unit 40.

Such method for forming a film is capable of stably producing a high-quality film on the surface of the large-diameter substrate 33, since it can maintain the gas mixture 112 containing the raw material mist 22 as a laminar flow while supplying the same to the substrate 33, thereby reducing generation of powder and abnormal growth.

The surface roughness of the smooth section 32*a* is preferably 150 μm or less. This enables more stable production of a film with higher quality.

The difference in height h between the surface of the smooth section 32*a* and the surface of the substrate 33 is preferably-1 mm or more and 1 mm or less. Such method for forming a film can more stably maintain the gas mixture 112 as a laminar flow, thereby stably and uniformly producing a high-quality film.

The angle θ between the surface of the smooth section 32*a* and the flowing direction of the gas mixture 112 into the smooth section 32*a* is preferably 0° or more and 60° or less. Such method for forming a film can more stably maintain the gas mixture 112 as a laminar flow, thereby more stably producing a high-quality film.

Second Embodiment

A second embodiment has the same configuration as the first embodiment except that the susceptor 32 illustrated in FIG. 3(*a*) is used, and the film formation is performed by intermittently rotating the susceptor 32 by 180 degrees.

In this case, as illustrated in FIG. 3(*a*), the gas mixture 112 is supplied to the placement section 32*b* from the top and bottom of the page, and accordingly, the smooth section 32*a* is formed in each inflow direction of the gas mixture 112.

This configuration also makes it possible to supply the gas mixture 112 to the surface of the substrate as a laminar flow.

Third Embodiment

A third embodiment has the same configuration as the first embodiment, except that the susceptor 32 illustrated in FIG. 3(*b*) is used, a nozzle (not shown) configured to eject the gas mixture 112 is opposite the susceptor 32, and the film formation is performed by changing the relative position between the nozzle and the susceptor 32 in a uniaxial direction.

In this case, as illustrated in FIG. 3(*b*), the gas mixture 112 is supplied to the placement section 32*b* from the top and bottom of the page, and accordingly, the smooth section 32*a* is formed in each inflow direction of the gas mixture. The smooth section 32*a* may at least include an area surrounded by an ejection port width W and a movable length L of the nozzle, excluding the placement section 32*b*.

The ejection port width W in this case may be equal to or longer than a width of the substrate parallel to W, and can be, for example, 1.0 times or more and twice or less of the width of the substrate. More preferably, the ejection port width W may be 1.1 times or more and 1.5 times or less in order to more stably and easily reduce deterioration in the film thickness distribution due to discontinuity in the mist concentration that is likely to occur at the nozzle end.

Additionally, while the movable length L depends on a shape and a configuration of the nozzle to be used, it may generally be equal to or longer than a width of the substrate parallel to L. The movable length L can be, for example, 1.0 times or more and 1.5 times or less of the width of the substrate, and more preferably 1.2 times or less from the viewpoint of productivity.

This configuration also makes it possible to supply the gas mixture 112 to the surface of the substrate as a laminar flow.

Fourth Embodiment

A fourth embodiment has the same configuration as the first embodiment except that the susceptor 32 with the smooth section 32*a* surrounding the placement section 32*b* as illustrated in FIG. 4 is used, and the film formation is performed by continuously rotating the susceptor 32 relative to the gas mixture 112 flowing in one direction.

As illustrated in FIG. 4, the film formation is performed by continuously rotating the susceptor 32 relative to the gas mixture 112 flowing in one direction. This configuration also makes it possible to supply the gas mixture 112 to the surface of the substrate as a laminar flow.

Fifth Embodiment

A fifth embodiment has the same configuration as the first embodiment except that the susceptor 32 with the smooth section 32*a* surrounding the placement section 32*b* as illustrated in FIG. 5 is used, and the film formation is performed by supplying the gas mixture 112 to the secured susceptor 32 as a rotational flow.

As illustrated in FIG. 5, the film formation is performed by supplying the gas mixture 112 to the secured susceptor 32 as a rotational flow. This configuration also makes it possible to supply the gas mixture 112 to the surface of the substrate as a laminar flow.

For the susceptor 32 in the first to fifth embodiments, the exemplified configurations include the circular placement section 32*b* corresponding to the circular substrate 33. However, the susceptor of the film-forming apparatus according to the present invention is not limited thereto, and the placement section can have a shape corresponding to the shape of the substrate as previously described.

In the first to fifth embodiments, the substrate 33 is mounted with the film formation surface facing up, but not limited thereto. A configuration in which the substrate 33 is mounted with the film formation surface facing down is also possible.

(Semiconductor Apparatus)

The method for forming a film according to the present invention can be applied to any film type of a metal film, a semiconductor film, and an insulator film, and particularly, it can suitably be used for producing a semiconductor film. Furthermore, a semiconductor film and a laminate obtained by the method for forming a film according to the present invention have reduced defects such as particles and abnormal growth and excellent electrical properties, and are industrially useful.

Such film and laminate can suitably be used for a semiconductor apparatus, etc. Furthermore, a crystal layer formed as a part of the laminate may be used as it is (in a state of the laminate), or may be applied to a semiconductor apparatus etc. after debonded from the crystal substrate, etc. by a known method.

Moreover, a semiconductor apparatus can be classified into a horizontal element (horizontal device) in which electrodes are formed on one side of a semiconductor layer, and a vertical element (vertical device) in which electrodes are provided on both of front and back sides of a semiconductor layer. At least a part of the laminate according to the present invention can suitably be used for both of horizontal and vertical devices. Particularly, it is preferably used for a vertical device.

Examples of the semiconductor apparatus include a schottky barrier diode (SBD), a metal-semiconductor field effect transistor (MESFET), a high electron mobility transistor (HEMT), a metal-oxide semiconductor field-effect transistor (MOSFET), a junction field-effect transistor (JFET), an insulated-gate bipolar transistor (IGBT), a light-emitting diode (LED), etc.

(α-Gallium Oxide Film)

An example of the film formed by the method for forming a film according to the present invention is an α-gallium oxide film.

A specific example of the α-gallium oxide film is the one formed on approximately an entire surface of a c-plane sapphire substrate having a diameter of 4 inches or more, wherein the α-gallium oxide film has a half width of an x-ray diffraction rocking curve peak of a (0006) plane of 9.5 seconds or less, and a film thickness distribution of ±9% or less.

Incidentally, "approximately an entire surface" as described herein refers to 80% or more of the total area of the substrate surface.

This enables the α-gallium oxide film to have good crystal orientation, a favorable film thickness distribution, and high quality.

Incidentally, the smaller half width of the rocking curve is more preferable, and thus a lower limit thereof exceeds 0 seconds, for example.

Additionally, an example of the film thickness distribution is a value obtained by using a known method such as optical interference spectroscopy to calculate film thickness at a plurality of points on the film surface, and dividing a difference between maximum and minimum values by a doubled average value.

Furthermore, although not particularly limited, an upper limit of the diameter of the c-plane sapphire substrate is about 12 inches (about 30 cm), for example.

An alternative example is an α-gallium oxide film to be formed on approximately an entire surface of a c-plane sapphire substrate having a diameter of 4 inches or more, wherein a foreign substance density in the α-gallium oxide film is 1.1 $cm^{-2}$ or less, and a film thickness distribution of the α-gallium oxide film is ±9% or less.

This enables the α-gallium oxide film to be formed on approximately an entire surface of a large-diameter substrate, with a low foreign substance density and high quality. The foreign substance herein refers to a convex object on the film surface, particularly including both of a particle and an abnormally grown grain, and can be detected by a known wafer defect inspection apparatus.

Note that the lower foreign substance density is more preferable and thus a lower limit thereof is 0 $cm^{-2}$, for example.

Furthermore, although not particularly limited, an upper limit of the diameter of the c-plane sapphire substrate is about 12 inches, for example.

EXAMPLE

Hereinafter, the present invention will be specifically described with reference to Examples and Comparative Examples. However, the present invention is not limited thereto.

Example 1

In the film-forming apparatus of FIG. 1, an α-gallium oxide film was formed according to the following procedure.

In the film-forming apparatus, a gas cylinder filled with nitrogen gas was used to supply a carrier gas. The gas cylinder was coupled to an atomization device by a tube made of urethan resin, and the atomization device was further coupled to a deposition chamber by a pipe made of quarts.

Firstly, a c-plane single crystal sapphire substrate having a thickness of 0.65 mm and a diameter of 4 inches (about 10 cm) was placed on a susceptor made of SiC having the surface structure of FIG. 2 and the inclination angle (θ) of 35°.

In this event, the difference in height h between the surface of the smooth section and the surface of the substrate was 0 mm.

Note that the surface roughness (arithmetic mean roughness) Ra_cor of the smooth section disposed in the susceptor was measured at 5 points in the plane of the smooth section by AFM (Nanosurf Nanite AFM), and an average value of 0.55 μm was obtained. Additionally, the surface roughness (arithmetic mean roughness) Ra_sub of the above sapphire substrate was measured at 5 points in a cruciform direction passing through the center of the substrate by AFM, and an average value of 0.08 nm was obtained.

Next, as a raw material solution, hydrochloric acid at a concentration of 34% was added to a diluted hydrochloric acid aqueous solution at a volume ratio of 1%, gallium acetylacetonate was dissolved therein in a proportion of 0.05 mol/L, and the resultant was loaded into the atomization device (atomizer).

Then, ultrasonic vibration was propagated by an ultrasonic vibration plate through water to the raw material solution in the atomization device, thereby atomizing the raw material solution (into a mist).

Next, nitrogen gas was added to the container of the raw material solution inside the atomization device (atomizer) at a flow rate of 20 L/min to form a gas mixture of the mist and the nitrogen gas.

Next, heating was performed such that a temperature of the substrate placed on the placement section of the susceptor became 450° C.

Next, the gas mixture was supplied to the deposition chamber and film formation was performed for 60 minutes.

Thereafter, the supply of the nitrogen gas was stopped to stop the supply of the gas mixture to the deposition chamber.

The film thus formed had clear and bright appearance in an area excluding 5 mm of an outer peripheral width of the film-formed surface.

The film was confirmed to be α-phase $Ga_2O_3$ (α-gallium oxide film) by X-ray diffraction measurement (Rigaku SmartLab).

At 5 points in the cruciform direction passing through the center of the substrate, rocking curve of the α-$Ga_2O_3$ (0006) plane was measured, and the half width was evaluated. Note that upon the rocking curve measurement, a four-crystal monochromator that combines two channel-cut crystals was used to increase monochromaticity of x-ray to enable the measurement with higher precision. Other measurement conditions are as follows.

Measurement Conditions

Measurement apparatus: SmartLab manufactured by Rigaku Holdings Corporation

Analysis Conditions:

Measurement method: rocking curve measurement (ω scan)

X-ray generation unit: anticathode Cu
output 45 kV 200 mA

Detection unit: semiconductor detector

Incident optical system: Ge (220) channel-cut monochromator

Soller slit: incident side
light receiving side 5.0°

Slit: incident side IS=1 (mm)
length limitation 0.5 (mm)
light receiving side RS1=1 RS2=1.1 (mm)

Scanning conditions: evaluated diffraction surface $Ga_2O_3$ (0006)
scanning axis ω
scanning mode step measurement
scanning range 18 to 22°
step width 0.005°
cumulative time 0.5 sec./step Additionally, a density of a foreign substance (having a diameter of 0.3 μm or more) in the area excluding 5 mm of the outer peripheral width of the film-formed surface was evaluated using substrate inspection equipment (KLA candela-CS10). Note that the foreign substance herein refers to a convex object on the film surface, particularly including both of a particle and an abnormally grown grain.

Thereafter, thickness of the fabricated film was measured at 21 points on the film surface by optical interference spectroscopy (Filmetrics F50), and a film thickness distribution was calculated by dividing a difference between maximum and minimum values by a doubled average value.

Example 2

A film was formed in the same manner as in Example 1 except that the surface roughness (arithmetic mean roughness) Ra_cor of the smooth section in Example 1 was changed to 183 μm.

The film thus formed had clear and bright appearance in an area excluding 5 mm of an outer peripheral width of the film-formed surface, and was confirmed to be α-phase $Ga_2O_3$ by X-ray diffraction measurement. Subsequently, the film was evaluated in the same manner as in Example 1.

Comparative Example 1

A film was formed in the same manner as in Example 1 except that the surface roughness (arithmetic mean roughness) Ra_cor of the smooth section in Example 1 was changed to 220 μm.

Slight cloudiness in appearance of the film thus formed was recognized from the outer periphery of the substrate adjacent to the smooth section to the inner side. The film was confirmed to be α-phase $Ga_2O_3$ by X-ray diffraction measurement. Subsequently, the film was evaluated in the same manner as in Example 1.

Example 3

A film was formed in the same manner as in Example 1 except that the difference in height h in Example 1 was changed to 0.85 mm (the substrate surface was at a higher level than the surface of the smooth section).

The film thus formed had clear and bright appearance in an area excluding 5 mm of an outer peripheral width of the film-formed surface, and was confirmed to be α-phase $Ga_2O_3$ by X-ray diffraction measurement. Subsequently, the film was evaluated in the same manner as in Example 1.

Example 4

A film was formed in the same manner as in Example 1 except that the difference in height h in Example 1 was changed to −0.85 mm (the substrate surface was at a lower level than the surface of the smooth section).

The film thus formed had clear and bright appearance in an area excluding 5 mm of an outer peripheral width of the film-formed surface, and was confirmed to be α-phase $Ga_2O_3$ by X-ray diffraction measurement. Subsequently, the film was evaluated in the same manner as in Example 1.

Comparative Example 2

A film was formed in the same manner as in Example 1 except that the surface roughness (arithmetic mean roughness) Ra_cor of the smooth section in Example 1 was changed to 220 μm, and further the difference in height h was changed to 1.2 mm.

Cloudiness in appearance of the film thus formed was recognized in a wide range from the outer periphery of the substrate adjacent to the smooth section to the inner side. The film was confirmed to be α-phase $Ga_2O_3$ by X-ray diffraction measurement. Subsequently, the film was evaluated in the same manner as in Example 1.

Comparative Example 3

A film was formed in the same manner as in Example 1 except that the surface roughness (arithmetic mean roughness) Ra_cor of the smooth section in Example 1 was changed to 220 μm, and further the difference in height h was changed to −1.2 mm.

Cloudiness in appearance of the film thus formed was recognized in a wide range from the outer periphery of the substrate adjacent to the smooth section to the inner side. The film was confirmed to be α-phase $Ga_2O_3$ by X-ray diffraction measurement. Subsequently, the film was evaluated in the same manner as in Example 1.

Example 5

A film was formed in the same manner as in Example 1 except that the inclination angle (θ) in Example 1 was changed to 55°.

The film thus formed had clear and bright appearance in an area excluding 5 mm of an outer peripheral width of the film-formed surface, and was confirmed to be α-phase $Ga_2O_3$ by X-ray diffraction measurement. Subsequently, the film was evaluated in the same manner as in Example 1.

Comparative Example 4

A film was formed in the same manner as in Example 1 except that the surface roughness (arithmetic mean roughness) Ra_cor of the smooth section in Example 1 was changed to 220 μm, and further the inclination angle (θ) was changed to 80°.

Cloudiness in appearance of the film thus formed was recognized in a wide range from the outer periphery of the substrate adjacent to the smooth section to the inner side. The film was confirmed to be α-phase $Ga_2O_3$ by X-ray diffraction measurement. Subsequently, the film was evaluated in the same manner as in Example 1.

Example 6

A film was formed in the same manner as in Example 1 except that the surface roughness (arithmetic mean roughness) Ra_cor of the smooth section in Example 1 was changed to 200 μm.

The film thus formed had clear and bright appearance in an area excluding 5 mm of an outer peripheral width of the film-formed surface, and was confirmed to be α-phase $Ga_2O_3$ by X-ray diffraction measurement. Subsequently, the film was evaluated in the same manner as in Example 1.

Example 7

A film was formed in the same manner as in Example 1 except that the surface roughness (arithmetic mean roughness) Ra_cor of the smooth section in Example 1 was changed to 150 μm.

The film thus formed had clear and bright appearance in an area excluding 5 mm of an outer peripheral width of the film-formed surface, and was confirmed to be α-phase $Ga_2O_3$ by X-ray diffraction measurement. Subsequently, the film was evaluated in the same manner as in Example 1.

Table 1 shows the evaluation results in Examples 1, 2, 3, 4, 5, 6, and 7, as well as Comparative Examples 1, 2, 3, and 4.

TABLE 1

| | Ra_cor [μm] | h [mm] | θ [°] | Appearance | Half width [sec] | Foreign substance [$cm^{-2}$] | Film thickness distribution |
|---|---|---|---|---|---|---|---|
| Ex. 1 | 0.55 | 0 | 35 | Clear bright | 9.1 | 0.33 | ±3.6% |
| Ex. 2 | 183 | 0 | 35 | Clear bright | 8.7 | 0.80 | ±4.0% |
| Comp. Ex. 1 | 220 | 0 | 35 | Cloudy | 67.3 | 17 | ±15.3% |
| Ex. 3 | 0.55 | 0.85 | 35 | Clear bright | 9.1 | 0.91 | ±8.7% |
| Ex. 4 | 0.55 | −0.85 | 35 | Clear bright | 9.2 | 0.88 | ±8.5% |
| Comp. Ex. 2 | 220 | 1.20 | 35 | Cloudy | 121.2 | 153 | ±25.2% |
| Comp. Ex. 3 | 220 | −1.20 | 35 | Cloudy | 108.0 | 149 | ±22.0% |
| Ex. 5 | 0.55 | 0 | 55 | Clear bright | 8.8 | 0.6 | ±4.5% |
| Comp. Ex. 4 | 220 | 0 | 80 | Cloudy | 87.4 | 250 | ±19.2% |
| Ex. 6 | 200 | 0 | 35 | Clear bright | 9.5 | 1.05 | ±5.3% |
| Ex. 7 | 150 | 0 | 35 | Clear bright | 8.6 | 0.74 | ±3.7% |

The films formed by the method for forming a film according to the present invention demonstrated the low half width (good crystal orientation), stable film growth performed with the favorable film thickness distribution, and the foreign substance density reduced to a low level. In contrast, the film formation by the conventional methods resulted in the deteriorated crystal orientation with cloudiness due to abnormal growth, and obvious increase in the film thickness distribution and the foreign substance density. It is believed that the increase in the surface roughness of the smooth section caused turbulence in the gas mixture flow, and as a result, the abnormal growth due to abnormal nucleation and adhesion of the foreign substances due to precipitation of the raw material solids were accelerated.

The above results have revealed that the present invention can provide a film-forming apparatus capable of stably producing a film with higher quality as compared with the conventional techniques.

The present description includes the following embodiments.

[1]: A method for forming a film, comprising the steps of:

atomizing a raw material solution into a mist to form a raw material mist;

mixing the raw material mist and a carrier gas to form a gas mixture;

placing a substrate on a placement section of a susceptor;

supplying the gas mixture from an atomizer to the substrate to perform film formation by thermal reaction on the substrate; and discharging the gas mixture after the film formation through an exhaust unit, wherein in the step of supplying the gas mixture from the atomizer to the substrate to perform film formation by thermal reaction on the substrate, at least a part of the gas mixture is supplied from a smooth section adjacent to the placement section to a surface of the substrate, the smooth section having a surface roughness of 200 μm or less.

[2]: The method for forming a film according to the above [1], wherein the surface roughness is 150 μm or less.

[3]: The method for forming a film according to the above [1] or [2], wherein difference in height between a surface of the smooth section and the surface of the substrate placed on the placement section is −1 mm or more and +1 mm or less.

[4]: The method for forming a film according to any one of the above [1] to [3], wherein an angle between a surface of the smooth section and a flowing direction of the gas mixture into the smooth section is 0° or more and 60° or less.

[5]: A film-forming apparatus, comprising:

a carrier gas supplier configured to supply a carrier gas;

an atomizer configured to atomize a raw material solution into a mist to generate a raw material mist;

a film-forming unit configured to supply a gas mixture of the raw material mist and the carrier gas to a substrate to perform film formation; and a heater capable of heating the substrate, wherein the film-forming unit has a susceptor comprising a placement section on which the substrate is placed, the susceptor comprises a smooth section adjacent to the placement section, on which at least a part of the gas mixture flows, and the smooth section has a surface roughness of 200 μm or less.

[6]: The film-forming apparatus according to the above [5], wherein the surface roughness is 150 μm or less.

[7]: The film-forming apparatus according to the above [5] or [6], wherein difference in height between a surface of the smooth section and a surface of the substrate placed on the placement section is −1 mm or more and +1 mm or less.

[8]: The film-forming apparatus according to any one of the above [5] to [7], wherein an angle between a surface of the smooth section and a flowing direction of the gas mixture into the smooth section is 0° or more and 60° or less.

[9]: A susceptor comprising a placement section on which a substrate is placed in a film-forming apparatus, the film-forming apparatus comprising: a carrier gas supplier configured to supply a carrier gas; an atomizer configured to atomize a raw material solution into a mist to generate a raw material mist; a film-forming unit configured to supply a gas mixture of the raw material mist and the carrier gas to the substrate to perform film formation; and a heater capable of heating the substrate, wherein a smooth section on which at least a part of the gas mixture flows is disposed adjacent to the placement section, and the smooth section has a surface roughness of 200 μm or less.

[10]: The susceptor according to the above [9], wherein the surface roughness is 150 μm or less.

[11]: The susceptor according to the above [9], wherein the smooth section has the surface roughness of 200 μm or less, and difference in height between a surface of the smooth section and a surface of the substrate placed on the placement section is −1 mm or more and +1 mm or less.

[12]: An α-gallium oxide film to be formed on approximately an entire surface of a c-plane sapphire substrate having a diameter of 4 inches or more, wherein the α-gallium oxide film has a half width of an x-ray diffraction rocking curve peak of a (0006) plane of 9.5 seconds or less, and a film thickness distribution of ±9% or less.

[13]: An α-gallium oxide film to be formed on approximately an entire surface of a c-plane sapphire substrate having a diameter of 4 inches or more, wherein a foreign substance density is 1.1 $cm^{-2}$ or less, and a film thickness distribution is ±9% or less.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A method for forming a film, comprising the steps of:

atomizing a raw material solution into a mist to form a raw material mist;

mixing the raw material mist and a carrier gas to form a gas mixture;

placing a substrate on a placement section of a susceptor;

supplying the gas mixture from an atomizer to the substrate to perform film formation by thermal reaction on the substrate; and discharging the gas mixture after the film formation through an exhaust unit, wherein in the step of supplying the gas mixture from the atomizer to the substrate to perform film formation by thermal reaction on the substrate, at least a part of the gas mixture is supplied from a smooth section adjacent to the placement section to a surface of the substrate, the smooth section having a surface roughness of 200 μm or less.

2. The method for forming a film according to claim 1, wherein the surface roughness is 150 μm or less.

3. The method for forming a film according to claim 1, wherein difference in height between a surface of the smooth section and the surface of the substrate placed on the placement section is −1 mm or more and +1 mm or less.

4. The method for forming a film according to claim 2, wherein difference in height between a surface of the smooth section and the surface of the substrate placed on the placement section is −1 mm or more and +1 mm or less.

5. The method for forming a film according to claim 1, wherein an angle between a surface of the smooth section and a flowing direction of the gas mixture into the smooth section is 0° or more and 60° or less.

6. The method for forming a film according to claim 2, wherein an angle between a surface of the smooth section and a flowing direction of the gas mixture into the smooth section is 0° or more and 60° or less.

7. A film-forming apparatus, comprising:

a carrier gas supplier configured to supply a carrier gas;

an atomizer configured to atomize a raw material solution into a mist to generate a raw material mist;

a film-forming unit configured to supply a gas mixture of the raw material mist and the carrier gas to a substrate to perform film formation; and a heater capable of heating the substrate, wherein the film-forming unit has a susceptor comprising a placement section on which the substrate is placed, the susceptor comprises a smooth section adjacent to the placement section, on which at least a part of the gas mixture flows, and the smooth section has a surface roughness of 200 μm or less.

8. The film-forming apparatus according to claim 7, wherein the surface roughness is 150 μm or less.

9. The film-forming apparatus according to claim 7, wherein difference in height between a surface of the smooth section and a surface of the substrate placed on the placement section is −1 mm or more and +1 mm or less.

10. The film-forming apparatus according to claim 8, wherein difference in height between a surface of the smooth section and a surface of the substrate placed on the placement section is −1 mm or more and +1 mm or less.

11. The film-forming apparatus according to claim 7, wherein an angle between a surface of the smooth section and a flowing direction of the gas mixture into the smooth section is 0° or more and 60° or less.

12. The film-forming apparatus according to claim 8, wherein an angle between a surface of the smooth section and a flowing direction of the gas mixture into the smooth section is 0° or more and 60° or less.

13. A susceptor comprising a placement section on which a substrate is placed in a film-forming apparatus, the film-forming apparatus comprising: a carrier gas supplier configured to supply a carrier gas; an atomizer configured to atomize a raw material solution into a mist to generate a raw material mist; a film-forming unit configured to supply a gas mixture of the raw material mist and the carrier gas to the substrate to perform film formation; and a heater capable of heating the substrate, wherein a smooth section on which at least a part of the gas mixture flows is disposed adjacent to the placement section, and the smooth section has a surface roughness of 200 μm or less.

14. The susceptor according to claim 13, wherein the surface roughness is 150 μm or less.

15. The susceptor according to claim 13, wherein the smooth section has the surface roughness of 200 μm or less, and difference in height between a surface of the smooth section and a surface of the substrate placed on the placement section is −1 mm or more and +1 mm or less.

16. An α-gallium oxide film to be formed on approximately an entire surface of a c-plane sapphire substrate having a diameter of 4 inches or more, wherein the α-gallium oxide film has a half width of an x-ray diffraction rocking curve peak of a (0006) plane of 9.5 seconds or less, and a film thickness distribution of ±9% or less.

17. An α-gallium oxide film to be formed on approximately an entire surface of a c-plane sapphire substrate having a diameter of 4 inches or more, wherein a foreign substance density in the α-gallium oxide film is 1.1 $cm^{-2}$ or less, and a film thickness distribution of the α-gallium oxide film is ±9% or less.

* * * * *